United States Patent [19]
Suda et al.

[11] Patent Number: 5,397,914
[45] Date of Patent: Mar. 14, 1995

[54] POWER TRANSISTOR DEVICE INCLUDING POWER TRANSISTORS IN DARLINGTON CONNECTION AND ZENER DIODE WHICH IS COUPLED BETWEEN COLLECTOR AND BASE OF POWER TRANSISTORS AND WHICH IS FORMED IN POLYSILICON FILM

[75] Inventors: Minoru Suda, Takasaki; Masatoshi Nakasu, Shibukawa; Tetsuo Iijima, Maebashi, all of Japan

[73] Assignee: Hitachi Ltd., Tokyo, Japan

[21] Appl. No.: 52,836

[22] Filed: Apr. 27, 1993

[30] Foreign Application Priority Data

Apr. 30, 1992 [JP] Japan .................................. 4-138034
Mar. 19, 1993 [JP] Japan .................................. 5-085429

[51] Int. Cl.⁶ ...................... H02H 9/02; G05F 1/613; H01L 27/02
[52] U.S. Cl. ........................ 257/570; 257/551; 257/577; 361/263; 315/209 T; 123/651; 327/110; 327/575
[58] Field of Search ............... 257/551, 567, 570, 603; 307/570, 253, 296.7, 310, 315; 361/263, 253, 254, 257; 123/651, 652; 315/209 T

[56] References Cited
U.S. PATENT DOCUMENTS

| | | |
|---|---|---|
| 4,013,904 | 8/1977 | Chick .................................. 257/567 |
| 4,186,713 | 2/1980 | Phoenix et al. .................. 123/148 E |
| 4,293,868 | 2/1981 | Iizuka et al. ........................ 257/570 |
| 4,455,989 | 6/1984 | Endo et al. ........................... 123/620 |
| 4,617,438 | 10/1986 | Nakata ......................... 219/10.55 B |
| 4,618,875 | 10/1986 | Flohrs ..................................... 357/46 |
| 4,928,053 | 4/1990 | Skard et al. ........................ 323/284 |
| 5,025,298 | 8/1990 | Fay et al. ............................. 257/529 |
| 5,079,608 | 11/1992 | Wodarczyk et al. ................ 257/379 |
| 5,115,369 | 5/1992 | Robb et al. .......................... 307/570 |
| 5,136,348 | 1/1992 | Tsuzuki et al. ..................... 257/603 |
| 5,204,988 | 4/1993 | Sakurai ................................. 257/603 |

Primary Examiner—Robert P. Limanek
Assistant Examiner—David B. Hardy
Attorney, Agent, or Firm—Fay, Sharpe, Beall, Fagan, Minnich & McKee

[57] ABSTRACT

In a transistor where collector is connected to an inductive load and switching current flows, a Zener diode comprising structure of plural pn-junctions constituted in series form to a polysilicon is provided between collector and base. Further MOSFET is switch-controlled by control voltage formed based on Zener current flowing through the Zener diode, and current path in parallel form to the Zener diode is constituted. Since temperature characteristic coefficient of a Zener diode formed in a polysilicon film is very small, the reverse voltage generated in the inductive load can be set to stable voltage in spite of the temperature variation. Further the MOSFET is provided in parallel form, thereby relatively large ON-resistance value of the Zener diode can be decreased.

11 Claims, 7 Drawing Sheets

POWER TRANSISTOR DEVICE INCLUDING POWER TRANSISTORS IN DARLINGTON CONNECTION AND ZENER DIODE WHICH IS COUPLED BETWEEN COLLECTOR AND BASE OF POWER TRANSISTORS AND WHICH IS FORMED IN POLYSILICON FILM

BACKGROUND OF THE INVENTION

The present invention relates to a power transistor device, particularly to effective technology to be utilized in so-called IC igniter in an ignition device of an internal combustion engine.

In the prior art, a Zener diode is provided between collector and base of a bipolar transistor device used in an ignition device (IC igniter) of a multicylinder internal combustion engine to be mounted on an automobile, in order to stabilize voltage of a primary coil applied to each cylinder. Reverse voltage generated in a primary coil is stabilized by Zener voltage of the Zener diode. Darlington transistor circuit is used as a power transistor device as above described. U.S. Pat. No. 4,618,875 discloses a power transistor device using a Darlington transistor circuit.

BRIEF SUMMARY OF THE INVENTION

In a power transistor device as above described, a Zener diode provided between collector and base is formed using pn-junction in silicon bulk. Therefor, Zener voltage of the Zener diode is determined by density and depth of pn-junction in the silicon bulk, and temperature characteristics of the Zener voltage in the Zener diode have positive temperature characteristic coefficient (usually about 1000–2000 ppm/° C.). Consequently, it has been made clear by the present inventor that if atmosphere temperature of a power transistor device rises, Zener voltage also rises.

For example, if Zener voltage of a Zener diode becomes large, since reverse voltage of a primary coil becomes large corresponding to this, output voltage from a secondary coil applied to each cylinder becomes large. Describing this using an example, when temperature characteristics of silicon bulk are 1500 ppm/° C. and atmosphere of a power transistor is at −40° C., it is assumed that Zener voltage is 370V and output voltage of a secondary coil is 50 kV. In this condition, if the atmosphere of the power transistor rises to 140° C., the Zener voltage will rise to about 470V and attendant on this, the output voltage of the secondary coil will exceed 60kV. In the prior art, a cable having sufficient dielectric withstand voltage taking account of such voltage variation has been used as a cable for the secondary coil. However, when the dielectric withstand voltage of the used cable is made small to intend the low cost or the light weight, output voltage during the voltage variation will become larger than the dielectric withstand voltage, and it has been made clear by the present inventor that the cable for the secondary coil may be broken.

An object of the present invention is to provide a power transistor device having stable collector voltage clamp function to the voltage variation.

The foregoing and other objects and novel features of the present invention will be apparent from the description of the specification and the accompanying drawings.

Outline of the representative invention disclosed in the present patent application will be briefly described as follows. In a transistor where collector is connected to an inductive load and switching current flows, a Zener diode comprising structure of a plurality of pn-junctions constituted in series form by a polysilicon polycrystalline silicon film is provided between its collector and base. Further, MOSFET subjected to switch control by control voltage formed based on Zener current flowing through the Zener diode is provided, and a current path in parallel to the Zener diode is constituted.

According to the above-mentioned means, since temperature characteristic coefficient of the Zener diode formed in the polysilicon film is very small, reverse voltage generated in the inductive load (the reverse voltage corresponds to a voltage generated in the inductive load due to a counter electromotive force of the inductive load) can be set to stable voltage in spite of the temperature variation. Further since the MOSFET is provided in parallel form, relatively large value of the ON-resistance of the Zener diode can be decreased.

DETAILED DESCRIPTION OF PREFERRED EMBODIMENTS

Figure 3:
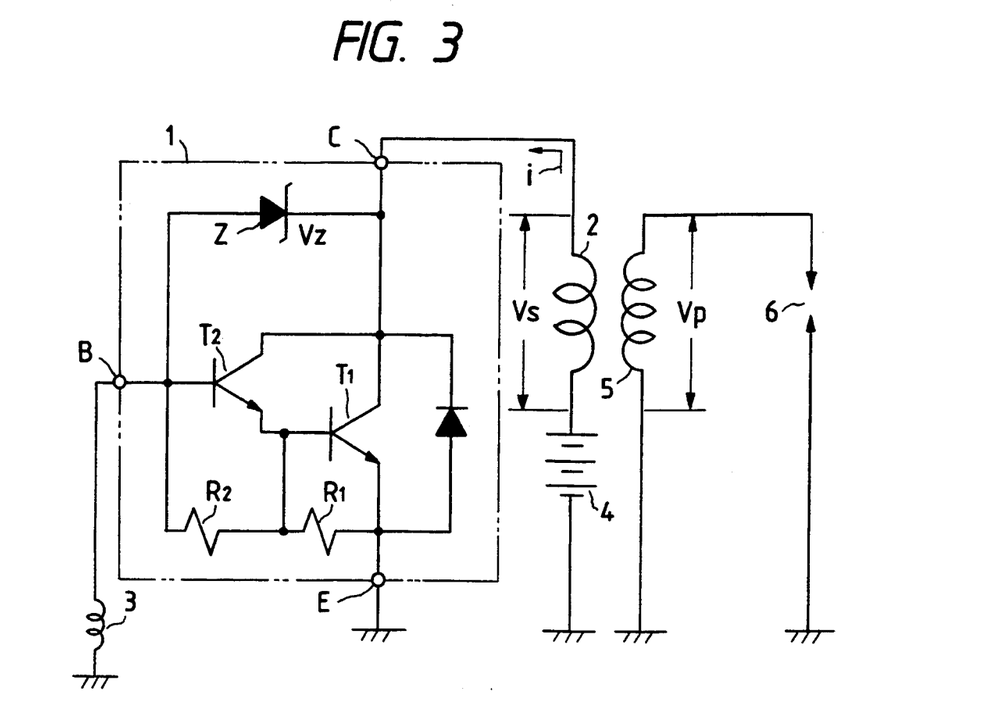
FIG. 3 is a circuit diagram showing an embodiment of a power transistor device according to the invention.

FIG. 3 shows a circuit diagram of an embodiment of a power transistor device according to the present invention. The power transistor device in this embodiment is constituted to be used in an igniter formed by so-called IC (semiconductor integrated circuit) (hereinafter referred to as "IC igniter"), and is assembled in single IC pellet. That is, the power transistor device is formed on one semiconductor substrate such as monocrystalline silicon by known manufacturing technology of semiconductor integrated circuit.

In the power transistor device 1, its collector connection terminal C is connected to one end of a primary coil 2, its base connection terminal B is connected to a pickup device 3, and its emitter connection terminal E is connected to the ground potential (earth) of the circuit. Battery voltage by a battery 4 is applied to other end side of the primary coil 2. A secondary coil 5 is coupled electromagnetically with the primary coil 2, and primary voltage is stepped up proportional to the turn ratio between the primary coil and the secondary coil, and then outputted from the secondary coil 5. The output voltage of the secondary coil 5 is supplied to an ignition plug 6.

In the power transistor device, a driver transistor $T_2$ in Darlington form as input side and a power transistor $T_1$ as output side are made a switching element. Between collector C commonly used in the driver transistor $T_2$ and the power transistor $T_1$ and base B of the driver transistor $T_2$, as voltage clamp means for clamping reverse voltage in the primary coil connected to collector (the reverse voltage corresponds to a voltage generated in the inductive load due to a counter electromotive force of the inductive load), a Zener diode Z utilizing pn-junction structure formed in the polysilicon polycrystalline silicon film as hereinafter described is provided. A resistor $R_2$ is provided between base and emitter of the transistor $T_2$, and a resistor $R_1$ is provided between base and emitter of the transistor $T_1$ respectively.

Figure 1:
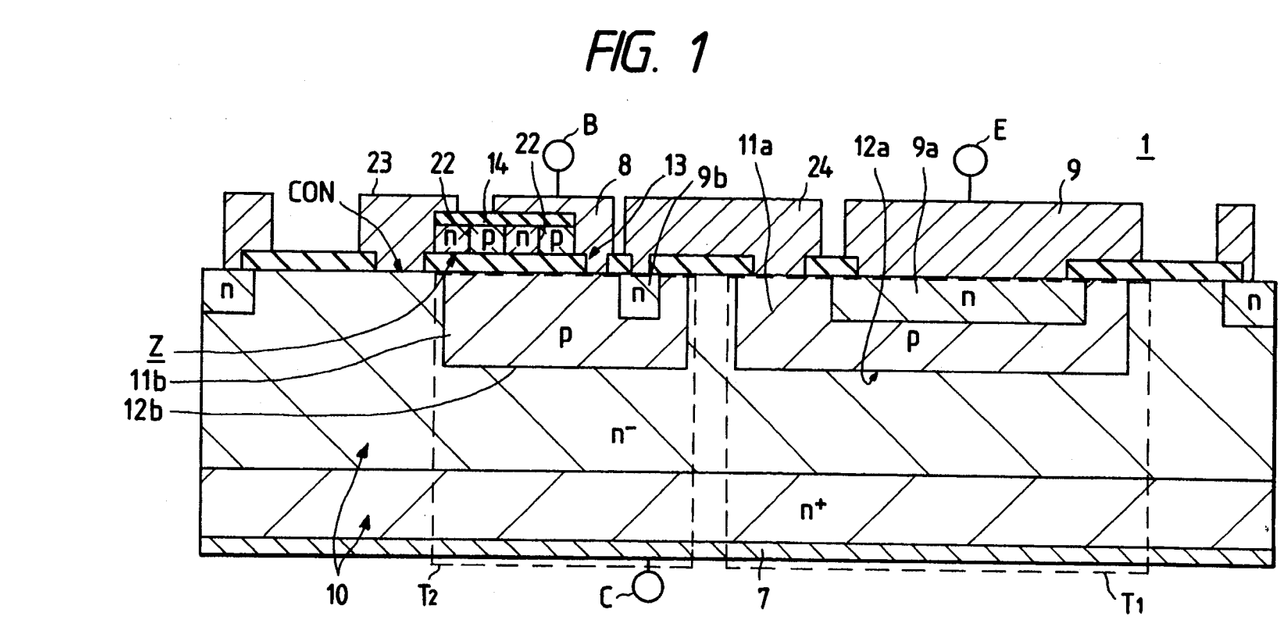
FIG. 1 is a sectional view of element structure showing an embodiment of a power transistor device according to the invention.

FIG. 1 is a sectional view showing element structure of an embodiment of a power transistor device according to the present invention. The power transistor device 1 is formed in a silicon substrate (hereinafter referred to as "substrate") 10 as n-conduction type semiconductor. Within the substrate 10, two domains, first base domain 11a and second base domain 11b of p-conduction type, in the two transistors $T_1$, $T_2$ are diffused and formed respectively from a first main plane. The first base domain 11a and the second base domain 11b, together with the substrate 10, form first pn-junction 12a and second pn-junction 12b respectively.

Within the first base domain 11a and the second base domain 11b, emitter domains 9a and 9b of n-conduction type in the two transistors $T_1$ and $T_2$ are diffused and formed respectively from the first main plane. In the first main plane of the substrate 10, an oxide film 13 as inert layer is selectively formed so as to cover a domain that each pn-junction in the first main plane is exposed to the surface.

On emitter domain 9a of the power transistor $T_1$, an emitter electrode 9 is formed in that metal material having conductivity such as aluminium is coated. The emitter connection terminal E in the power transistor device 1 is connected to the emitter electrode 9.

On base domain 11b of the driver transistor $T_2$, a base electrode 8 is formed in that metal material having conductivity such as aluminium is coated. The base connection terminal B in the power transistor device 1 is connected to the base electrode 8.

On a second main surface of the substrate 10, a collector electrode 7 is formed in that metal material having conductivity such as aluminium is coated. The collector connection terminal C in the power transistor device 1 is connected to the collector electrode 7.

Base of the transistor $T_1$ and emitter of the transistor $T_2$ are electrically connected mutually through wiring means 24 coated by metal material having conductivity such as aluminium.

On the domain of the oxide film 13 formed on the base domain 11b of the driver transistor $T_2$, a Zener diode Z is formed by pn-junction structure formed in a polysilicon film. The pn-junction structure utilizing the polysilicon film will be described referring to a manufacturing process diagram showing in FIG. 4.

FIG. 4 shows a manufacturing process diagram of an embodiment of a Zener diode Z to be used in the power transistor device 1 according to the present invention.

Figure 4A:
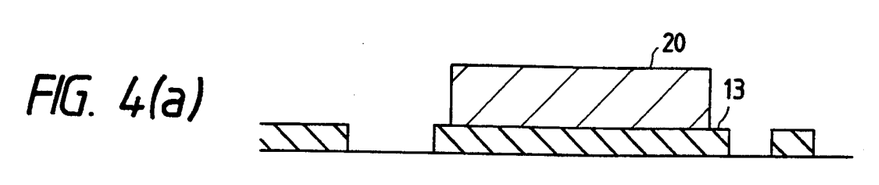
FIGS. 4(a)–4(d) show steps of a manufacturing process explaining a manufacturing method of a Zener diode used in a power transistor device according to the invention.

As shown in FIG. 4(a), on an oxide film 13 formed on a surface of a base domain 11b of a driver transistor $T_2$, a polysilicon film 20 is selectively coated by CVD method or the like.

Figure 4B:
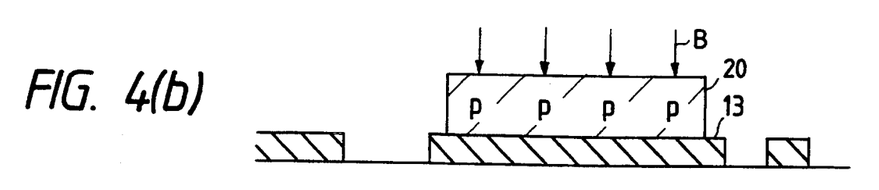

As shown in FIG. 4(b), boron (B) as p-conduction type impurity is implanted to the polysilicon film 20 by suitable means such as ion implantation method, and p-conduction type domain is formed to the polysilicon film 20.

Figure 4C:
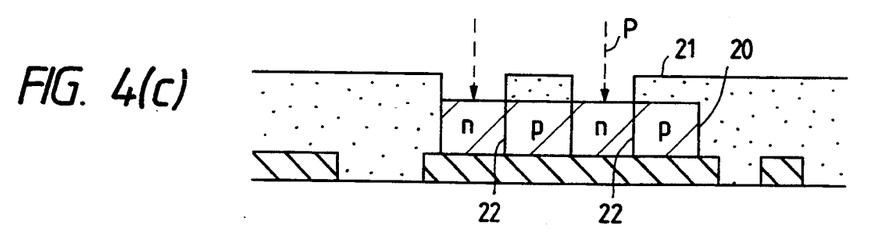

As shown in FIG. 4(c), on the polysilicon film 20 being the p-conduction type domain, a mask 21 by a resist is formed by lithography treatment. Phosphorus (P) as n-conduction type impurity is introduced selectively to the polysilicon film 20 through the mask 21 by means such as ion implantation method. Thereby in the polysilicon film 20, a plurality of pn-junctions 22 are formed in series to each other. In FIG. 4(c), although the p-conduction type domains and the n-conduction type domains are shown in only four domains in total for convenience, since Zener voltage Vz as hereinafter described is determined by withstand voltage of the pn-junction 22, the number of provided pn-junctions 22 becomes large corresponding to desired Zener voltage Vz.

Figure 4D:
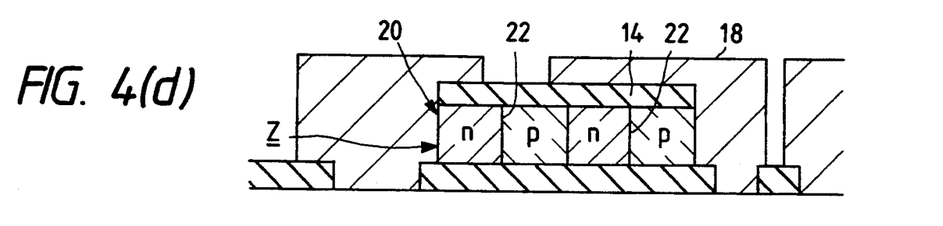

As shown in FIG. 4(d), a protective oxide film 14 is formed on the polysilicon film 20 where a plurality of pn-junctions 22 are formed.

In the Zener diode Z by the plurality of pn-junctions 22 formed on the polysilicon film 20 manufactured as above described, p-conduction type domain at one end of the pn-junction 22 group is electrically connected to the base electrode 8, and n-conduction type domain at other end of the pn-junction 22 group is electrically connected to the second main plane of the substrate 10, i.e., the collector electrode 7, through the wiring means 23 coated by metal material having conductivity such as aluminium and a contact part CON with the substrate 10.

In addition, in the circuit diagram of FIG. 3, the resistors $R_1$ and $R_2$ provided between base and emitter of the transistors $T_1$ and $T_2$ respectively, are formed in the substrate 10 of FIG. 1 but omitted in the figure.

Figure 2:
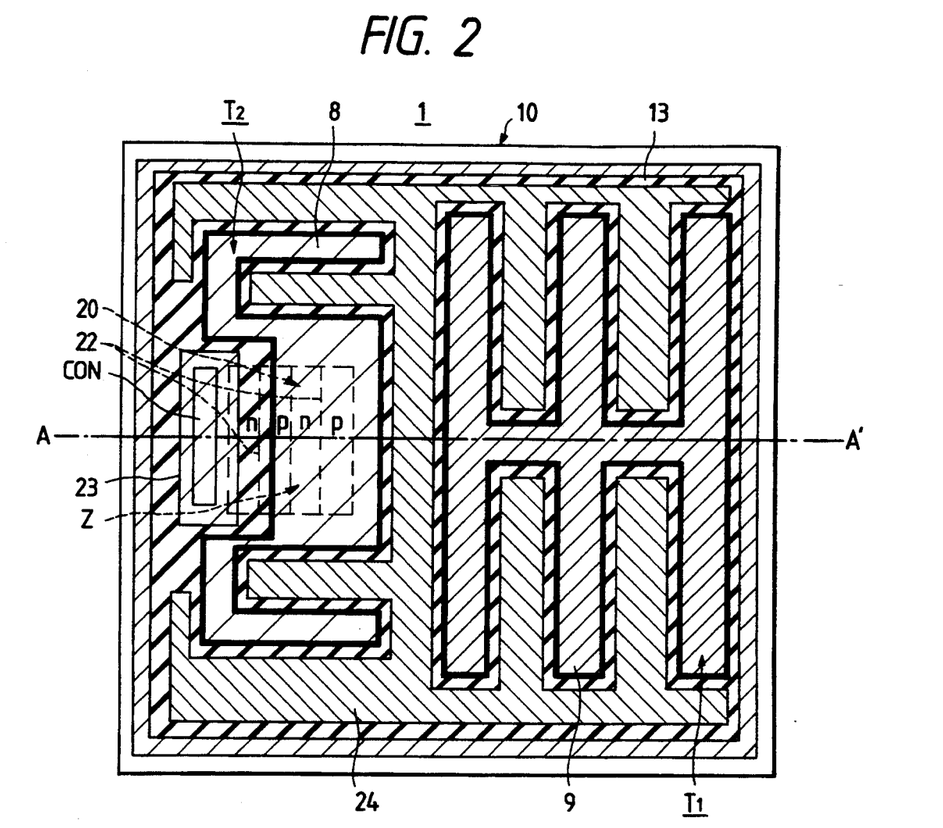
FIG. 2 is a layout diagram showing an embodiment of a power transistor device according to the invention.

FIG. 2 shows a layout diagram of an embodiment of a power transistor device 1 according to the present invention. In FIG. 2, a thick hatched part is an oxide film, and a thin hatched part is formed by metal material having conductivity such as aluminium. Also, a thick frame part is an electrode. A part enclosed by dotted line is a part formed under an oxide film or metal material, which cannot be seen directly from the upper side of the device 1.

In addition, a diagram showing sectional structure in dash-and-dot line A-A' of FIG. 2 is FIG. 1.

The emitter electrode 9 of the power transistor $T_1$ is formed to the right side of the chip, and the base electrode 8 of the driver transistor $T_2$ is formed to the left side of the chip. The Zener diode is formed nearly under the base electrode 8 of the driver transistor $T_2$ and nearly on the base domain (not shown) on the chip.

p-conduction type domain at one end to constitute anode electrode of the Zener diode Z, although not particularly limited thereto, is connected to the base electrode 8 from the lateral side, and n-conduction type domain at one end to constitute cathode electrode is connected to the substrate acting as the collector domain of the transistors $T_1$ and $T_2$, through the wiring means 23 formed by metal material or the like and the contact part CON.

Next, referring to the circuit diagram of FIG. 3, operation of a power transistor circuit 1 according to the present invention will be described when it is used as so-called IC igniter. The IC igniter is mounted on an automobile so as to control ignition timing of an engine. If transistors $T_2$ and $T_1$ are turned on by a pickup device 3 to indicate timing of engine ignition, current i flows through a primary coil 2 being made an inductive load by collector current of the power transistor $T_1$. Since the driver transistor $T_2$ and the power transistor $T_1$ are in Darlington form, relatively small base current supplied from the pickup device 3 to base of the driver transistor $T_2$ is amplified by resultant current amplification factor of the two transistors $T_1$ and $T_2$ into large current and made current i flowing through the primary coil 2.

In the ignition timing by the pickup device 3, if supply of base current of the transistors $T_2$ and $T_1$ is interrupted and these transistors $T_2$ and $T_1$ are turned off, the current i of the primary coil 2 is interrupted. In the primary coil 2, reverse voltage Vs is generated by the interruption of the current i. The voltage Vs is subjected to voltage clamp by Zener voltage Vz of the Zener diode Z and becomes constant voltage. The voltage Vs is stepped up by the number of turns of the primary coil 2 and the number of turns of the secondary coil 5 thereby high voltage Vp is formed. The high voltage Vp is supplied to the electrode of the ignition plug 6 thereby spark is generated and engine ignition is carried out.

Although not particularly limited thereto, current supplied to the base connection terminal B of the power transistor device 1 is controlled in the optimum timing by a computer or the like, based on the ignition signal detected by the pickup device 3 installed within the distributor.

In this embodiment, the Zener diode is constituted using the pn-junction formed in the polysilicon film. In such Zener diode formed utilizing the polysilicon film, the temperature characteristic coefficient (ppm/° C.) is quite small so that it becomes about zero. Consequently, in wide temperature range from low temperature of −40° C. to high temperature of +140° C., the voltage Vs of the primary coil 2 can be made nearly constant.

Corresponding to this, also the output voltage Vp formed proportional to the turn ratio between the primary coil 2 and the secondary coil 5 is made stable high voltage. Consequently, the stable spark voltage can be obtained over the wide temperature range as above described. Thereby the dielectric withstand voltage of the cable to introduce the output voltage Vp into the ignition plug can be made the necessary minimum value, and the low cost and the light weight become possible.

When a Zener diode utilizing a diffusion layer is used as in the prior art, because of the temperature characteristics, if the Zener voltage Vz is set to about 350V so as to obtain sufficient primary coil voltage even at as low temperature as −40° C., at as high temperature as +140° C., the voltage becomes too high such as 440V or more and the dielectric withstand voltage of the cable connected to the secondary coil 5 becomes a problem. Therefore the electric path including the cable to introduce the voltage Vp of the secondary coil into the ignition plug must be formed so as to have sufficient dielectric withstand voltage taking into account of the temperature characteristics as above described.

Figure 5:
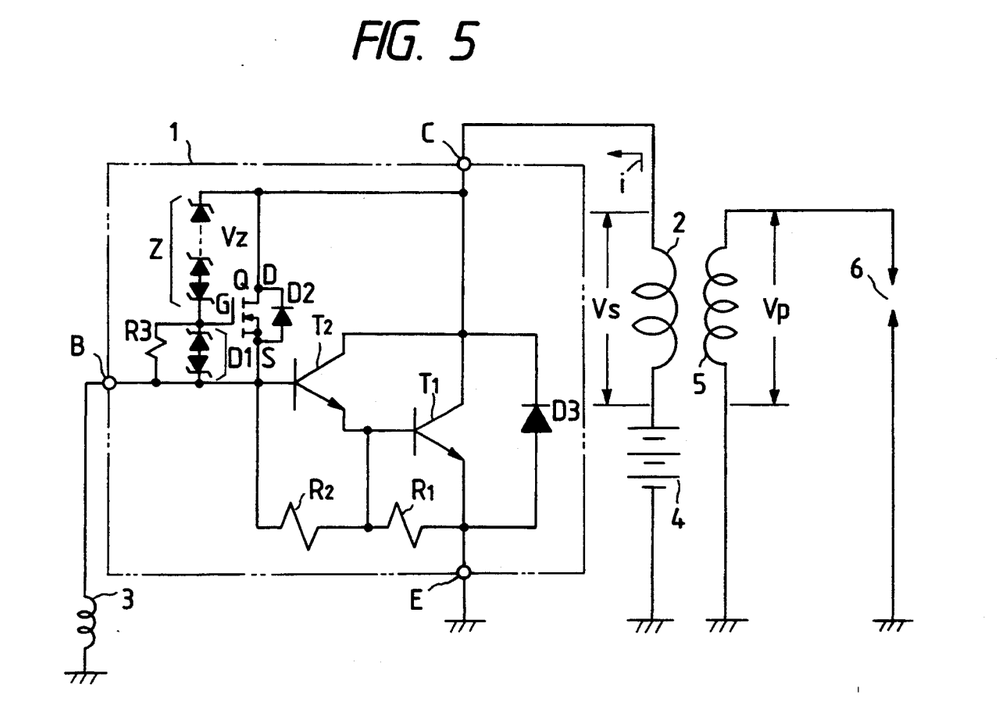
FIG. 5 is a circuit diagram showing another embodiment of a power transistor device according to the invention.

FIG. 5 shows a circuit diagram of another embodiment of a power transistor device according to the present invention. In the preceding embodiment, as the voltage clamp means, the Zener diode Z is constituted utilizing the pn-junction formed in the polysilicon film. Then since the ON-resistance value is relatively large, e.g., 300Ω, when current value of the break down current flowing through the Zener diode Z by the reverse voltage Vs is large and the current value varies, the clamp voltage Vs of the primary coil varies due to the resistance component.

Therefore in this embodiment, a diode D1 is connected to the Zener diode Z, and the voltage is supplied to gate and source of MOSFETQ, and source and drain of the MOSFETQ are connected to base and collector of a transistor $T_2$ respectively. In other words, the MOSFETQ having small ON-resistance and the Zener diode z having large ON-resistance constitute a current path in parallel form. A resistor $R_3$ is provided between gate and source of the MOSFETQ.

Although not particularly limited thereto, as the diode D1, pn-junction formed in the polysilicon film is utilized. Also the resistor $R_3$ is formed by suitable impurity introduced in the polysilicon film.

Figure 6:
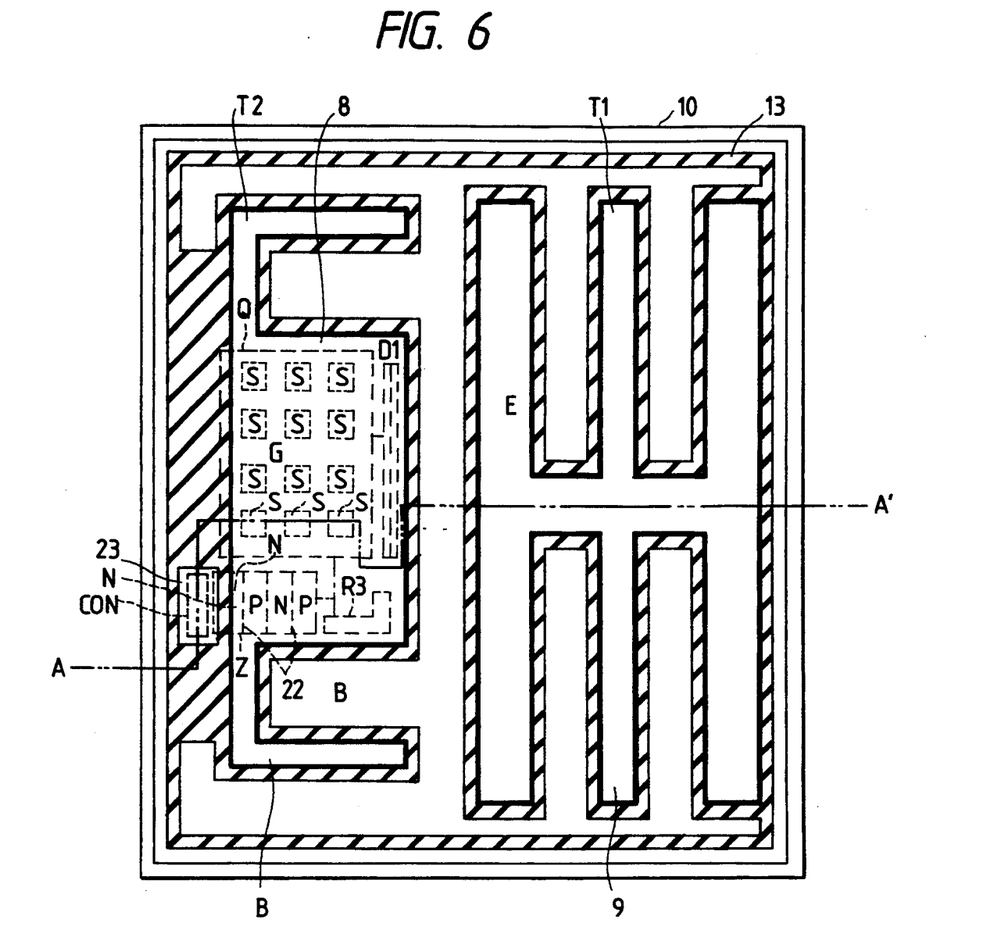
FIG. 6 is a layout diagram showing an embodiment of a power transistor device of FIG. 5.

FIG. 6 shows a layout diagram of an embodiment of a power transistor device in FIG. 5. Since basic constitution of FIG. 6 is similar to that of FIG. 2, only difference shall be described. Although not particularly limited thereto, in addition to base bonding pad to constitute lower side of the gate connection electrode B of the driver transistor $T_2$ and a Zener diode Z utilizing the polysilicon film on the gate domain, MOSFETQ is formed in a domain close to the Zener diode Z, and a diode D1 connected between gate and source and a diode D2 connected between source and drain of the MOSFET are formed. Thus since the Zener diode Z, the diodes D1, D2 and the MOSFETQ are arranged and constituted under the base bonding pad to constitute the base connection electrode B of the driver transistor $T_2$, the above-mentioned elements can be formed without enlarging the substantial chip size of the power transistor device.

In FIG. 6, a part enclosed by thick hatched line shows an oxide film, and a part enclosed by dotted line shows wiring means formed by aluminium or the like or a part hidden under an electrode. Also a part designated by dash-and-dot line shows connection relation between elements.

Figure 7:
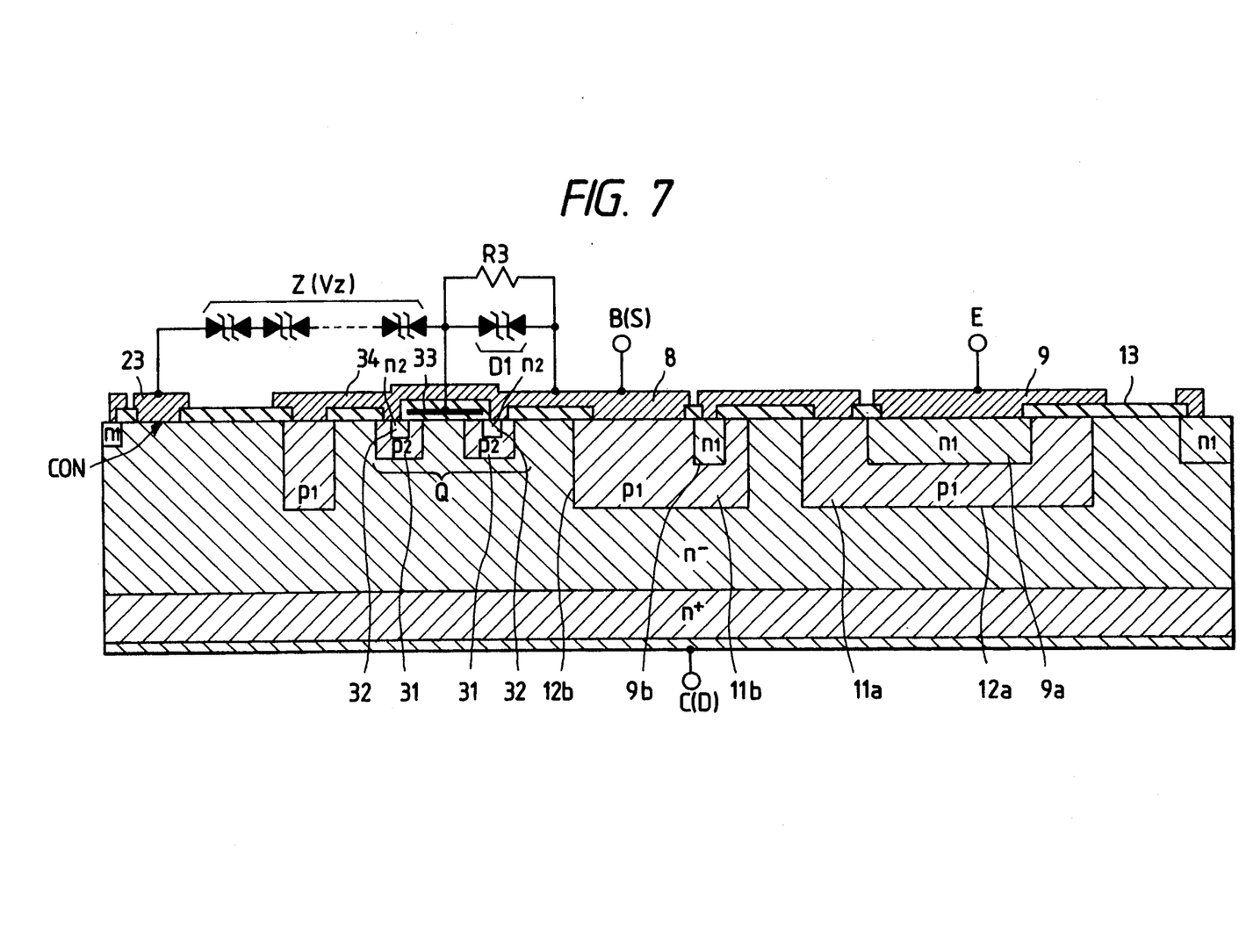
FIG. 7 is a sectional view of element structure showing an embodiment of a power transistor device of FIG. 5.

In addition, an element section structure diagram designated by dash-and-two-dots line A—A' in FIG. 6 is shown in FIG. 7 as hereinafter described.

FIG. 7 shows a sectional view of element structure of an embodiment the power transistor device 10 of FIG. 6 cut in dash-and-two-dots A—A'. In the MOSFETQ, a substrate of n-conduction type is used as drain domain. Thereby collector domain of the transistors $T_1$ and $T_2$ and drain domain of the MOSFETQ are constituted integrally and electrically connected to a collector connection terminal C connected to the primary coil 2.

Channel domain of the MOSFETQ is constituted by P2 domain 31 of p-conduction type formed in the substrate of n-conduction type. $n_2$ domain 32 of n-conduction type is formed to the P2 domain 31, and is used as source domain. A gate electrode 33 is formed on the channel domain 31 interposed between the source domain 32 and the substrate through a thin gate insulation film. A base electrode 8 of the transistor $T_2$ is extended as it is, and connected to the source domain 32.

Although not particularly limited thereto, domain with MOSFETQ formed therein is enclosed by $P_1$ domain to be connected electrically to the base domain of the transistor $T_2$ so that it is not affected by a parasitic transistor.

Figure 8:
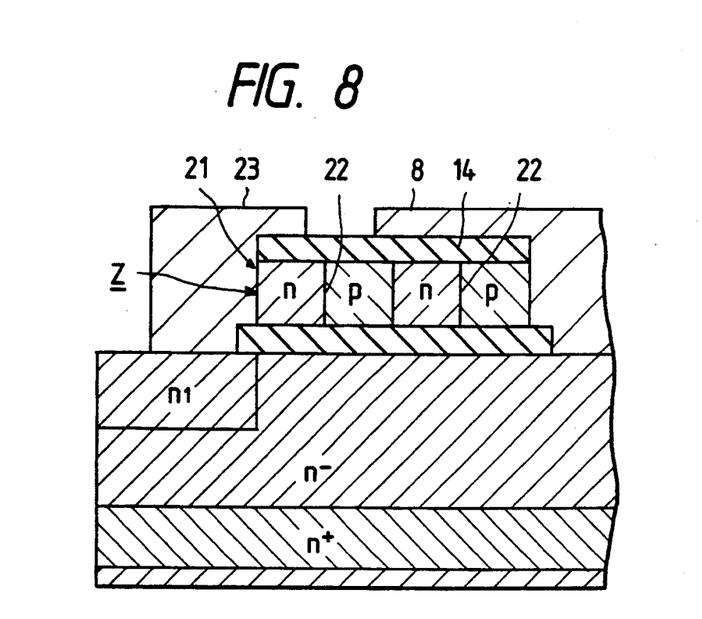
FIG. 8 is a sectional view of element structure showing an embodiment of a Zener diode corresponding to the embodiment circuit of FIG. 5.

FIG. 8 shows a sectional view of element structure of a Zener diode Z corresponding to the embodiment circuit of FIG. 5. n-conduction type domain at one end side acting as a cathode electrode of the Zener diode is connected to $n_1$ domain of n-conduction type for ohmic contact provided on the first main plane of the substrate by wiring means 23 made of metal material of suitable conductivity such as aluminium layer. The ohmic contact domain $n_1$ is a semiconductor domain formed simultaneously with emitter domain of the transistors $T_1$ and $T_2$, and is shown as contact CON in the layout of FIG. 6.

p-conduction type domain at other end side acting as anode electrode of the Zener diode Z is connected to a gate electrode 33 of MOSFETQ by the wiring means made of metal material of suitable conductivity such as aluminium layer. The manufacturing method of the Zener diode Z of this embodiment is similar to that in the embodiment of FIG. 4, and the description shall be omitted.

In the embodiment shown in FIG. 5, when the transistors $T_2$ and $T_1$ are turned off by the pickup device 3, if the breakdown of the Zener diode Z is produced by the reverse voltage generated in the primary coil 2, break current flows through the diode D and the MOSFETQ is turned on by the voltage of the diode D. Since the reverse voltage generated in the primary coil 2 is subjected to the voltage clamp action by currents flowing both the Zener diode Z and the MOSFETQ, even if the Zener diode Z has relatively large resistance, e.g., 300Ω, as the ON-resistance of the MOSFETQ is small, e.g., 100Ω, resultant ON-resistance can be made as small as 75Ω. As a result, influence of the ON-resistance of the Zener diode Z is suppressed to the minimum, thereby the voltage Vz of the primary coil 2 can be stabilized corresponding to the desired Zener voltage. In response to this, the step-up output voltage Vp generated in the secondary coil 5 can be also stabilized.

Figure 9:
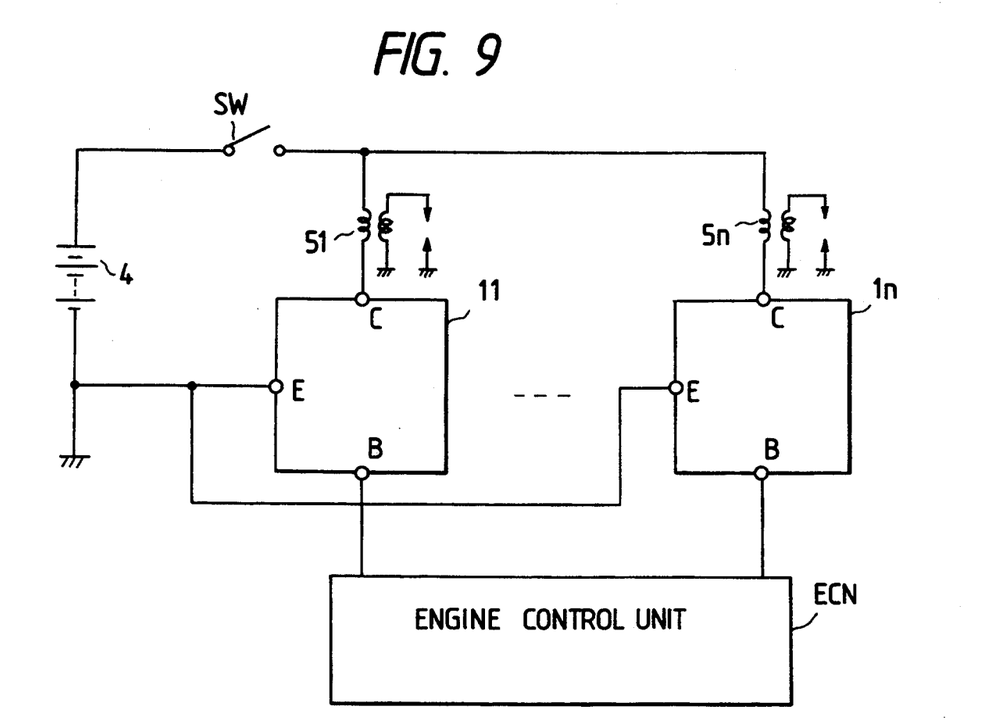
FIG. 9 is a diagram showing a system to control ignition timing of an engine using a plurality of power transistor devices of FIG. 3 or FIG. 5.

FIG. 9 is an ignition device system diagram for controlling ignition timing of a multicylinder internal combustion engine for an automobile or the like using a plurality of power transistor devices of FIG. 3 or FIG. 5.

In FIG. 9, n pieces of the power transistor devices are used, and although not particularly limited thereto, the internal combustion engine of n cylinders is controlled using n pieces of the power transistor devices. Numerals 11–1n designate power transistor devices in FIG. 3 or FIG. 5. Collector terminal C of the power transistor devices 11 and in is connected through the primary coils 51 and 5n, the switch SW to the battery 4. Emitter terminal E of 11 and 1n is earthed to the ground level. Also base terminals of 11 and 1n are connected to an engine control unit ECN constituted by microcomputers. The engine control unit ECN outputs signals of prescribed level in sequence to base terminals of 11 and 1n, based on information such as rotational speed of the engine, in the prescribed timing.

The switch SW is a switch for controlling ON/OFF state of the engine. For example, when the system is utilized in an internal combustion engine containing 6-cylinder engine, 6 power transistor devices are required.

Also the power transistor devices 11 through in need not be formed in separate substrates, and although not particularly limited thereto, they may be formed in substrates of less than n in number, and further in one substrate.

In addition, the resistance R3 in parallel to the diode D1 is installed to absorb the external disturbing surge. The diode D2 provided between drain and source of the MOSFETQ is a parasitic diode produced from the semiconductor structure, Also the diode D3 between collector and emitter of the transistors $T_1$ and $T_2$ is a parasitic diode.

Actions and effects obtained from the embodiments are as follows.

(1) In a power transistor device, since a plurality of pn-junctions are provided in parallel in a polysilicon film and a Zener diode is formed, withstand voltage characteristics of pn-junction having very small temperature characteristic coefficient can be utilized as Zener voltage, thereby the Zener voltage can be maintained constant in spite of temperature variation of wide range.

(2) Since a Zener diode in above item (1) is provided and a power transistor device is used in an IC igniter, primary voltage can be maintained to prescribed voltage even in an engine room where temperature is varied in wide range from low temperature to high temperature, thereby the primary voltage being stepped up also can be stably operated, and ignition operation of the engine can be maintained stably. As a result, since dielectric withstand voltage in the cable to connect the secondary coil and the ignition plug can be set to the necessary minimum value, the low cost and the light weight becomes possible.

(3) A polysilicon film is formed on a first main plane of a substrate and pn-junction group is formed, thereby the structure and the manufacturing process are simplified and the productivity can be improved.

(4) Since Zener voltage of the Zener diode can be set by the number of pn-junctions formed on the polysilicon film, the Zener voltage can be easily set to desired voltage value.

(5) MOSFET is formed and is switch-controlled by voltage signal formed based on Zener current of a Zener diode, and a current path in parallel formation to the Zener diode is constituted, thereby the reverse voltage in the induction load can be subjected to voltage clamp stably, even if Zener having relatively large ON-resistance is used.

(6) According to the above item (5), in the case of use in the IC igniter, since the primary voltage can be maintained to prescribed voltage even in the engine room where temperature varies in wide range from low temperature to high temperature, the secondary voltage being stepped up can be operated stably, and ignition operation of the engine can be maintained stably. As a result, since the dielectric withstand voltage in the cable to connect the secondary coil and the ignition plug can be set to the necessary minimum value, the low cost and the light weight becomes possible.

(7) MOSFET is arranged under the base bonding pad of the driver transistor T2, thereby the stable voltage clamp operation as above described can be carried out without enlarging the chip size of the power transistor device.

The invention made by the present inventor has been described concretely based on embodiments, but the present invention is not limited by the embodiments, and it is needless to say that the invention may be changed variously without departing from its scope and spirit. For example, arrangement of the Zener diode Z formed in the polysilicon film can adopt various embodying types, that is, formation under the base electrode, formation spreading over the junction of base and collector and the like. Transistor may be constituted in addition to Darlington form, driver transistor $T_2$ at input side may be omitted and other transistor circuit such as a power transistor may be constituted.

Although invention made by the present inventor has been mainly described in the case of application to the IC igniter being the utilization field as the background, the invention is not limited to this, but can be widely utilized as a power transistor device to drive the inductive load.

Effects obtained by the representative invention disclosed in the present patent application will be briefly described as follows. In a power transistor device, plural pn-junctions are arranged in parallel in a polysilicon film and Zener diode is formed, thereby withstand voltage characteristics of pn-junction having quite small temperature characteristic coefficient can be utilized as Zener voltage, and the Zener voltage can be maintained constant in spite of the temperature variation in wide range. MOSFET is switch-controlled by voltage signal formed on the Zener current of the Zener diode, and a current path in parallel formation to the Zener diode is constituted, thereby the reverse voltage in the inductive load can be subjected to the voltage clamp stably even using Zener diode having relatively large ON-resistance.

What is claimed is:

1. A power transistor device for an ignition system of an internal combustion engine mounted on an automobile comprising:
   a pair of transistors in Darlington connection serving as a power transistor having a collector to be coupled to an inductive load and a base to be coupled to receive an input signal and for selectively making a switching current in response to said input signal; and
   a Zener diode coupled between said collector and said base of said pair of transistors and constituted by a plurality of pn-junctions formed in a film of polycrystalline silicon,
   wherein a voltage generated in said inductive load based on the switching current is clamped by a Zener voltage of said Zener diode,
   wherein a temperature coefficient of said Zener diode is substantially zero, so that said voltage generated in the inductive load is set to a stable voltage in spite of temperature variation, and
   wherein the film with said Zener diode formed therein is arranged over a base layer of one of said pair of transistors which receives said input signal at said base thereof in a main plane of a silicon substrate.

2. A power transistor device for an ignition system of an internal combustion engine mounted on an automobile, comprising:
   a power transistor having a collector to be coupled to an inductive load for selectively making a switching current in response to an input signal;
   a Zener diode coupled between said collector and a base of said power transistor and constituted by a plurality of Dn-junctions formed in a film of polycrystalline silicon; and
   a MOSFET which is switch-controlled by a control voltage formed based on a Zener current flowing through said Zener diode, and which constitutes a current path in parallel to said Zener diode,
   wherein a voltage generated in said inductive load based on the switching current is clamped by a Zener voltage of said Zener diode,
   wherein a temperature characteristic coefficient with respect to said Zener voltage of said Zener diode is substantially zero, so that said voltage generated in the inductive load is set to a stable voltage in spite of temperature variation,
   wherein said MOSFET uses a semiconductor domain constituted integrally with a collector domain of the transistor as a drain domain, uses a semiconductor domain formed within said drain domain as a channel domain, and uses a semiconductor domain formed within said channel domain as a source domain, and
   wherein a gate electrode of said MOSFET is provided over the channel domain interposed between said source domain and said drain domain through a gate insulation film.

3. A power device comprising:
   a terminal;
   a power transistor having an input coupled to receive an input signal and a current path coupled to the terminal, wherein the power transistor performs switching operations in response to the input signal to selectively form a current at the current path thereof;
   first and second Zener diodes coupled in series between the terminal and the input of the power transistor; and
   a transistor having an input coupled to a common connection point of the first and second Zener diodes and a current path coupled between the terminal and the input of the power transistor.

4. A power device according to claim 3, wherein the first Zener diode is constituted by pn-junctions formed in a film of polycrystalline silicon.

5. A power device according to claim 4, further comprising:
   a semiconductor substrate,
   wherein the film of polycrystalline silicon in which the first Zener diode is formed is formed on an insulation layer formed over a main surface of the semiconductor substrate in which the power transistor is formed.

6. A power device according to claim 4, wherein a temperature coefficient of said first Zener diode is substantially zero.

7. A power device according to claim 4, wherein the second Zener diode is constituted by pn-junctions formed in a film of polycrystalline silicon.

8. A power device according to claim 3,
   wherein the power transistor includes a bipolar transistor having a base, a collector and an emitter,
   wherein the terminal is coupled to the collector of the bipolar transistor,
   wherein the input of the power transistor corresponds to the base of the bipolar transistor, and wherein the current path of the power transistor corresponds to a collector-emitter path of the bipolar transistor.

9. A power device according to claim 3,
wherein the power transistor includes a pair of bipolar transistors in Darlington connection having a base, a collector and an emitter,
wherein the terminal is coupled to the collector of one of the pair of bipolar transistors,
wherein the input of the power transistor corresponds to the base of the other of the pair of bipolar transistors, and
wherein the current path of the power transistor corresponds to a collector-emitter path of the one of the pair of bipolar transistors.

10. A power device according to claim 3,
wherein the transistor is turned on in response to a Zener current flowing through the first and second Zener diodes.

11. A power device according to claim 3,
wherein the transistor includes a MOSFET having a gate serving as the input of the transistor and a drain-source path serving as the current path of the transistor.

* * * * *